(12) United States Patent
Then et al.

(10) Patent No.: US 11,575,036 B2
(45) Date of Patent: Feb. 7, 2023

(54) GALLIUM NITRIDE TRANSISTORS WITH SOURCE AND DRAIN FIELD PLATES AND THEIR METHODS OF FABRICATION

(71) Applicant: Intel Corporation, Santa Clara, CA (US)

(72) Inventors: Han Wui Then, Portland, OR (US); Stephan Leuschner, Munich (DE); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 16/651,327

(22) PCT Filed: Sep. 28, 2017

(86) PCT No.: PCT/US2017/054184
§ 371 (c)(1),
(2) Date: Mar. 26, 2020

(87) PCT Pub. No.: WO2019/066878
PCT Pub. Date: Apr. 4, 2019

(65) Prior Publication Data
US 2020/0227545 A1 Jul. 16, 2020

(51) Int. Cl.
*H01L 29/40* (2006.01)
*H01L 29/778* (2006.01)
(Continued)

(52) U.S. Cl.
CPC .... *H01L 29/7786* (2013.01); *H01L 21/28587* (2013.01); *H01L 21/765* (2013.01);
(Continued)

(58) Field of Classification Search
CPC .......... H01L 29/7786; H01L 21/28587; H01L 21/765; H01L 29/2003; H01L 29/205;
(Continued)

(56) References Cited

U.S. PATENT DOCUMENTS 9,202,880 B1 * 12/2015 Corrion ............. H01L 29/66462
2011/0221011 A1 * 9/2011 Bahat-Treidel ....... H01L 29/404
257/E21.54
(Continued)

FOREIGN PATENT DOCUMENTS

WO   WO-2014-052948   4/2014

OTHER PUBLICATIONS

International Preliminary Report on Patentability for International Patent Application No. PCT/US2017/054184 dated Apr. 9, 2020, 9 pgs.
(Continued)

*Primary Examiner* — S M Sohel Imtiaz
(74) *Attorney, Agent, or Firm* — Schwabe, Williamson & Wyatt, P.C.

(57) ABSTRACT

Gallium nitride (GaN) transistors with source and drain field plates are described. In an example, a transistor includes a gallium nitride (GaN) layer above a substrate, a gate structure over the GaN layer, a source region on a first side of the gate structure, a drain region on a second side of the gate structure, the second side opposite the first side, a source field plate above the source region, and a drain field plate above the drain region.

14 Claims, 11 Drawing Sheets

(51) Int. Cl.
  *H01L 21/285* (2006.01)
  *H01L 21/765* (2006.01)
  *H01L 29/20* (2006.01)
  *H01L 29/205* (2006.01)
  *H01L 29/423* (2006.01)
  *H01L 29/66* (2006.01)
  *H03F 3/21* (2006.01)
  *H03F 3/45* (2006.01)

(52) U.S. Cl.
  CPC ........ *H01L 29/2003* (2013.01); *H01L 29/205* (2013.01); *H01L 29/404* (2013.01); *H01L 29/42316* (2013.01); *H01L 29/66462* (2013.01); *H03F 3/21* (2013.01); *H03F 3/45183* (2013.01); *H03F 2200/451* (2013.01)

(58) Field of Classification Search
  CPC ............. H01L 29/404; H01L 29/42316; H01L 29/66462; H01L 29/0847; H01L 29/4236; H01L 29/4232; H03F 3/21; H03F 3/45183; H03F 2200/451
  See application file for complete search history.

(56) References Cited

U.S. PATENT DOCUMENTS

| | | | |
|---|---|---|---|
| 2012/0211800 A1* | 8/2012 | Boutros | H01L 29/4175 257/E29.317 |
| 2015/0021619 A1* | 1/2015 | Briere | H01L 29/205 257/76 |
| 2015/0021707 A1* | 1/2015 | Mikhalev | H01L 29/404 257/382 |
| 2017/0148912 A1* | 5/2017 | Chu | H01L 29/4236 |
| 2017/0194488 A1* | 7/2017 | Gao | H01L 29/0692 |
| 2017/0200794 A1* | 7/2017 | Huang | H01L 29/7787 |
| 2018/0033631 A1* | 2/2018 | Bera | H01L 29/7787 |

OTHER PUBLICATIONS

International Search Report and Written Opinion for International Patent Application No. PCT/US2017/054184 dated Jun. 28, 2018, 12 pgs.

* cited by examiner

GALLIUM NITRIDE TRANSISTORS WITH SOURCE AND DRAIN FIELD PLATES AND THEIR METHODS OF FABRICATION

CROSS-REFERENCE TO RELATED APPLICATION

This patent application is a U.S. National Phase Application under 35 U.S.C. § 371 of International Application No. PCT/US2017/054184, filed Sep. 28, 2017, entitled "GALLIUM NITRIDE TRANSISTORS WITH SOURCE AND DRAIN FIELD PLATES AND THEIR METHODS OF FABRICATION," which designates the United States of America, the entire disclosure of which is hereby incorporated by reference in its entirety and for all purposes.

TECHNICAL FIELD

Embodiments of the present disclosure relate to semiconductor integrated circuits and more particularly to GaN transistors with source and drain field plates.

BACKGROUND

RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and future 5G standards. RF PAs typically operate at several dB back-off from its saturated mode in order to meet the linearity requirements. Thus, the efficiency suffers and in most PAs, it may degrade by a factor of 2-3×. Due to its wide bandgap and high critical breakdown electric field, gallium nitride (GaN) transistors are considered for high voltage applications such as power converters, RF power amplifiers, RF switch and high voltage applications. Simple transistor architecture, namely, having a single gate, source and drain, falls short of realizing the full potential of GaN in achieving the maximum breakdown voltage as dictated by its material properties. This is because the drain electric field concentrates at the edge of the gate and causes premature breakdown.

EMBODIMENTS OF THE DISCLOSURE

Figure 1:
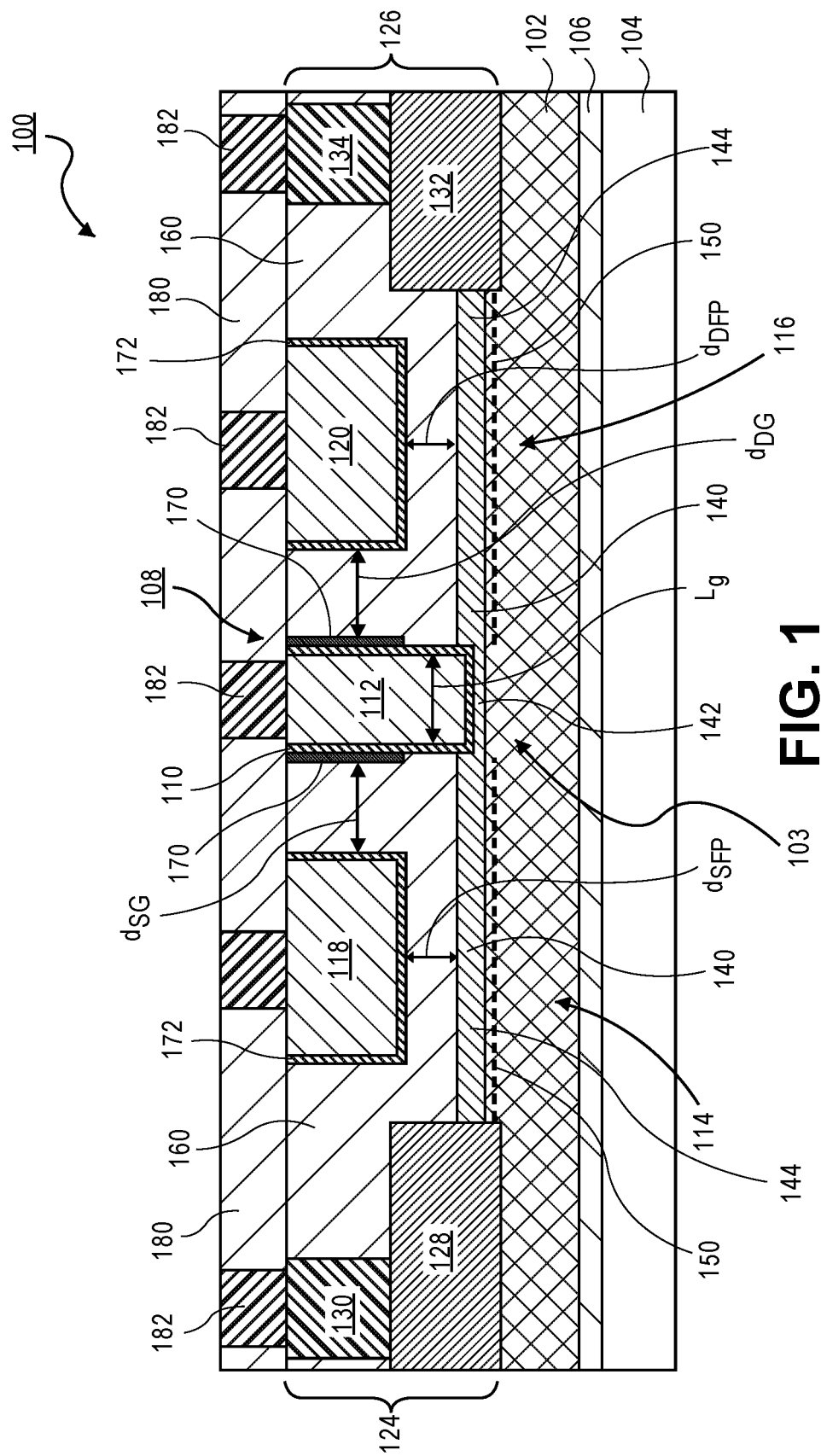
FIG. 1 illustrates as transistor having a source field plate and a drain field plate in accordance with embodiments of the present disclosure.

Gallium nitride (GaN) transistors with source and drain field plates are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Embodiments of the present disclosure relate to transistors having a source field plate and a drain field plate. In embodiments, the transistors of the present disclosure have a gallium nitride (GaN) layer disposed above a substrate. A gate structure is disposed above the GaN layer. A source region and a drain region are disposed on opposite sides of the gate structure. A source field plate is located above the source region and a drain field plate is located above the drain region. The source field plate and the drain field plate may be spaced a distance from the source region and the drain region, respectively, which may be the same or different from one another. Similarly, the source field plate and the drain field plate may be separated from the gate structure by a distance which may be the same or different from one another. In an embodiment, the transistor is a symmetrical transistor and may be used as a bidirectional switch. The source field plate and the drain field plate may be biased to an electrical potential which is different than a gate voltage and/or VSS offering a greater degree of control of the drain field. The transistors of the present disclosure may enable new circuit architectures, such as a cross-coupled pairs. Additionally, the distance of the drain field plate from the drain can be independently adjusted to improve the affect the field plate has on the drain field distribution, and hence increased breakdown voltage and linearity. In an embodiment, the transistor is operated in an enhancement mode. In an embodiment, the transistor may include a second gate structure or multiple gate structures disposed between the gate structure and the drain field plate to provide a multigate switch for, for example, an RF voltage divider.

FIG. 1 illustrates as transistor 100 having a source field plate and a drain field plate in accordance with embodiments of the present disclosure. Transistor 100 includes a GaN layer 102 disposed above a substrate 104. A buffer layer 106 may be disposed between GaN layer 102 and substrate 104. A gate structure 108 is disposed above GaN layer 102 as illustrated in FIG. 1. Gate structure 108 may include a gate dielectric 110, such as a high k gate dielectric, such as but not limited to hafnium oxide (e.g., $HfO_2$) and aluminum oxide (e.g., $Al_2O_3$), and a gate electrode 112, such as a metal gate electrode. A source region 114 and a drain region 116 are disposed on opposite sides of gate structure 108 as illustrated in FIG. 1.

Transistor 100 includes a source field plate 118 located above source region 114 and a drain field plate 120 located above drain region 116. Source field plate 118 is separated from source region 114 by a distance ($d_{SFP}$) and drain field plate 120 is separated from drain region by a distance ($d_{DFP}$) as illustrated in FIG. 1. In an embodiment, the distance ($d_{SFP}$) is equal to the distance ($d_{DFP}$). In another embodiment, $d_{SFP}$ is greater than $d_{DFP}$. In yet another embodiment, $d_{DFP}$ is greater than $d_{SFP}$.

Source field plate 102 is separated from gate structure 108 by a distance $d_{SG}$ and drain field plate 120 is separated from gate structure 108 by a distance $d_{DG}$. In an embodiment, $d_{SG}$ is equal to $d_{DG}$. In another embodiment, $d_{SG}$ is greater than $d_{DG}$. In still yet another embodiment, $d_{DG}$ is greater than $d_{SG}$.

In an embodiment, source region 114 includes a source contact 124 and drain region 116 includes a drain contact 126. Source contact 124 may include a source semiconductor contact 128 and a source metal contact 130, and drain contact 126 may include a drain semiconductor contact 132 and a drain metal contact 134. In an embodiment as illustrated in FIG. 1, source semiconductor contact 128 and drain semiconductor contact 132 are formed from a III-N semiconductor, such as but not limited to indium, gallium and nitrogen (InGaN). In an embodiment, the III-N semiconductor has an N+ conductivity, such as, for example, greater than $1 \times 10^{18}$ atoms/cm$^3$. In an embodiment, the source metal contact 130 and the drain metal contact 134 comprise a metal, such as but not limited to tungsten. In an embodiment, source field plate 118 is located laterally between source metal contact 130 and gate structure 108 as illustrated in FIG. 1. In an embodiment, drain field plate 120 is located laterally between drain metal contact 134 and gate structure 108 as shown in FIG. 1.

Transistor 100 may include as polarization layer 140 disposed on GaN layer 102. Polarization layer 140 may be formed from a group III-N semiconductor, such as but not limited to aluminum indium nitride (AlInN), aluminum indium gallium nitride (AlGaInN) and indium gallium nitride (InGaN). In an embodiment, polarization layer 140 is sufficiently thick in order to create a two-dimensional electron gas (2DEG) effect or layer 150 in the top surface of GaN layer 102 as illustrated in FIG. 1. In an embodiment, polarization layer 140 has a portion 142 beneath gate structure 108 which is thinner than portion 144 above source region 114 and drain region 116 so that a 2DEG layer or effect is not created in gallium nitride layer 102 beneath gate structure 108 as shown in FIG. 1. In an embodiment, polarization layer 140 is completely removed from under gate structure 108 and gate structure 108 is disposed directly on GaN layer 102. In an embodiment, transistor 100 is operated in an enhancement mode.

In an embodiment, a dielectric layer 160 is disposed above GaN layer 102. Source field plate 118, drain field plate 120 and gate structure 108 are disposed within dielectric layer 160 as illustrated in FIG. 1. In an embodiment, the top surface of source field plate 118 and the top surface of drain field plate 120, are coplanar with the top surface of gate structure 108 as illustrated in FIG. 1. In an embodiment, the top surface of dielectric layer 160 is coplanar with the top surfaces of source field gate 118, gate structure 108, and drain field plate 120 as illustrated in FIG. 1. In an embodiment, the top surface of source metal contact 130 and the top surface of drain metal contact 134 are coplanar with the top surface of source field plate 118, the top surface of gate structure 108 and the top surface of drain field plate 120.

Transistor 100 has a gate length (Lg) in a first direction extending between the source region 114 and the drain region 116 as shown in FIG. 1. A channel region is located in GaN layer 102 beneath gate structure 108 and between source region 114 and drain region 116. Transistor 100 has a gate width (Gw) in a direction perpendicular (in and out of the page) to the gate length (Lg) direction. In an embodiment, the source field plate extends over the entire gate width (Gw) of transistor 100. In an embodiment, drain field plate 120 extends the entire gate width (Gw) of transistor 100.

In an embodiment, source field plate 118 and drain field plate 120 may be biased separately from a gate voltage (Vg) applied to gate structure 108. In an embodiment, source field plate 118 and drain field plate 120 may be biased to a potential different than Vss or ground. In an embodiment, source field plate 118 and drain field plate 120 may be biased independently of one another.

In an embodiment, a pair of insulative spacers 170 are disposed along opposite sides of gate structure 108 as illustrated in FIG. 1. In an embodiment, insulative spacers 170 do not extend the entire height of gate structure 108. In an embodiment, insulative spacers 170 do not contact polarization layer 140 or GaN layer 102. In an embodiment, insulative spacers 170 are formed from an insulative material, such as but not limited to silicon nitride and silicon oxynitride, which is different from the dielectric material of dielectric layer 160.

In an embodiment, a second dielectric layer 180 is disposed over dielectric layer 160. A plurality of conductive vias 182 may be disposed in dielectric 180 to enable independent electrical connections to source region 114, drain region 116, source field plate 118, drain field plate 120 and gate structure 108.

In an embodiment, a high k dielectric 172, such as but not limited to hafnium oxide (e.g., $HfO_2$) and aluminum oxide (e.g., $Al_2O_3$) may be disposed on the sidewalls and bottom surface of source field plate 118 and on the sidewalls and bottom surface of drain field plate 120 as illustrated in FIG. 1. In an embodiment, high k dielectric 172 is the same high k dielectric material as gate dielectric layer 110 of gate structure 108.

In an embodiment of the present disclosure, transistor 100 is a symmetrical transistor whereby current may flow from the drain region to the source region in a manner similar to the current flow from the source region to the drain region. That is, source region 114 may act as a drain region, and the drain region 116 may act as a source region in transistor 100. In this way, transistor 100 may be said to be a bidirectional transistor. In an embodiment of the present disclosure, transistor 100 is a bidirectional switch. In an embodiment, transistor 100 is a symmetrical transistor where the distance ($d_{SG}$) between the source field plate 118 and the gate structure 108 is equal to the distance ($d_{DG}$) between the drain field plate 120 and the gate structure 108, and wherein the distance ($d_{SFP}$) between the source field plate 118 and the source region 114 is equal to the distance ($d_{DFP}$) between the drain field plate 120 and the drain region 116.

Figure 2:
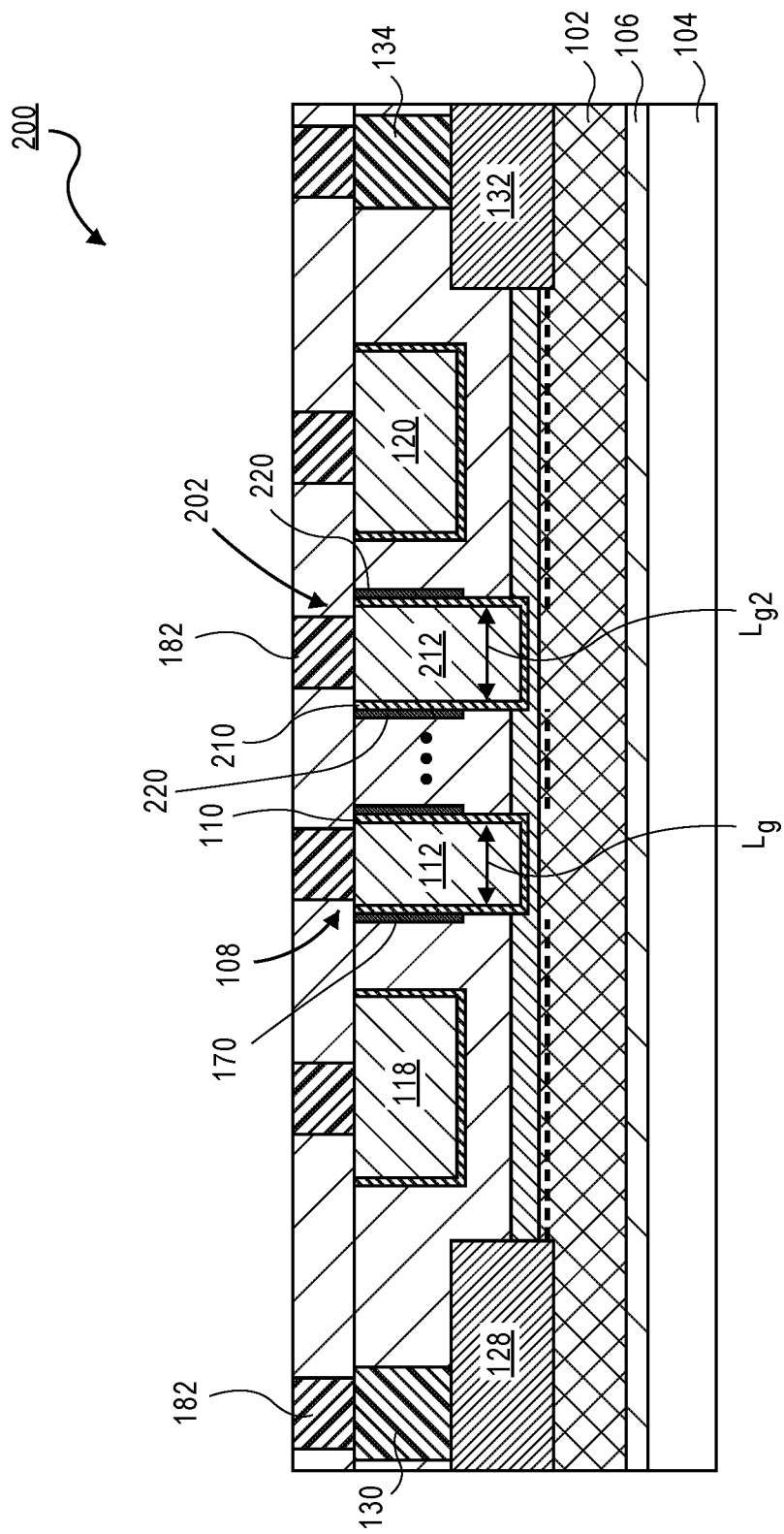
FIG. 2 illustrates a GaN transistor having a source field plate and a drain field plate and having multiple gates in accordance with embodiments of the present disclosure.

FIG. 2 illustrates a GaN transistor 200 having a source field plate and a drain field plate and having multiple gates. Transistor 200 includes a second gate structure 202 above GaN layer 102 and between gate structure 108 and drain field plate 120 as illustrated in FIG. 2. Second gate structure 202 may be recessed into polarization layer 140 so that a 2DEG layer of effect is not formed under second gate structure 202 as illustrated in FIG. 2. Gate structure 202 may include a gate dielectric 210, such as a high k gate dielectric, and a gate electrode 212 as described with respect to gate structure 108. In an embodiment, insulating spacers 220 may be disposed on opposite sidewalls of gate structure 202 as illustrated in FIG. 2. Insulative spacers 220 may not extend the entire height of gate structure 202 as illustrated in FIG. 2. In an embodiment, the second gate structure 202 has a larger gate length Lg2) than the gate length (Lg) of gate structure 108. That is, in an embodiment, Lg2 is greater than Lg. In an embodiment, Lg2 is equal to Lg.

In an embodiment, two or more additional gate structures 202 may be disposed over GaN layer 102 and between gate structure 108 and drain field plate 120. In an embodiment, gate structure 108 and each of the additional gate structures 202 may be bias separately. In an embodiment, the multiple gates act as an RF voltage divider allowing each gate to be biased with a lower DC voltage. A single gate NMOS transistor may require a large negative gate voltage (Vg) to keep the transistor in an "OFF" state.

Figure 3A:
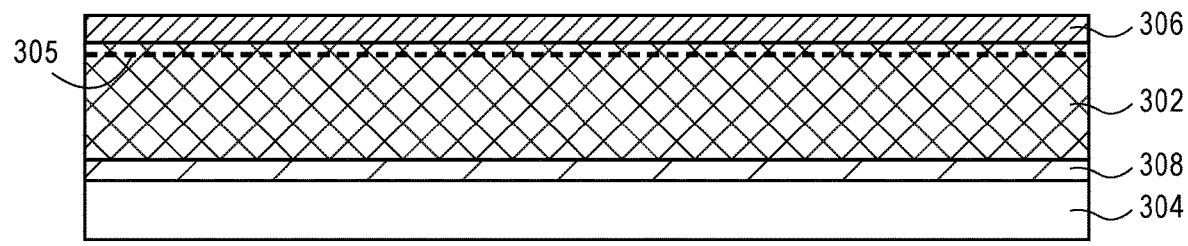
FIGS. 3A-3J illustrate a method of forming a transistor having a source field plate and a drain field plate in accordance with embodiments of the present disclosure.

FIGS. 3A-3J illustrate a method of forming a transistor having a source field plate and a drain field plate in accordance with embodiments of the present disclosure. A gallium nitride (GaN) layer 302 may be disposed above a substrate 304, such as but not limited to a monocrystalline silicon substrate, a silicon carbide substrate, and aluminum oxide ($Al_2O_3$) substrate. As shown in FIG. 3A, a polarization layer 306, such as but not limited to aluminum gallium nitride (AlGaN), aluminum indium gallium nitride (AlInGaN) and indium gallium nitride (InGaN) may be disposed on GaN layer 302. Polarization layer may be formed to a thickness, such as greater than 10 nm, sufficient to create a 2DEG layer 305 or effect in the top surface of GaN layer 302 as illustrated in FIG. 3A. In an embodiment, the top surface of GaN layer 302 is the (0001) plane or the c-plane of GaN. A buffer layer 308 may be disposed between substrate 304 and GaN layer 302.

Buffer layer 308 may contain one or more layers having a lattice constant between the lattice constant of substrate 304 and GaN layer 302. Polarization layer 306 is a III-N semiconductor, such as but not limited to aluminum gallium indium nitride ($Al_xGa_{1-x-y}In_yN$, where $0<x<=1$, $0<y<=1$) which is formed to a sufficient thickness to create a two dimensional electron gas (2-DEG) layer 305 in the top portion of GaN layer 302. In an embodiment, polarization layer 306 consists of multiple layers, such as AlN/$Al_{0.2}Ga_{0.8}N/Al_{0.83}In_{0.17}N$, where the AlN is to the bottommost layer. In an embodiment, the polarization layer 306 has a thickness of approximately 10 nanometers.

In a specific embodiment, substrate 304 is a monocrystalline silicon substrate, buffer layer 308 includes an aluminum nitride layer having a thickness between 100-300 nm disposed on the monocrystalline silicon substrate and a graded aluminum gallium nitride layer with a higher aluminum concentration near the aluminum nitride layer. Integrated circuits, for example, a system-on-chip (SOC) or a microprocessor, may be formed from silicon transistors, such as nonplanar transistors, fabricated on portions of silicon substrate 304 not covered by the GaN layer 302. In another embodiment, substrate 304 is a silicon carbide (SiC) substrate and buffer layer 308 comprises aluminum nitride having a thickness, for example, between 100-300 nm. Polarization layer 306, buffer layer 308, GaN layer 302 may be formed by any well-known technique, such as but not limited to chemical vapor deposition (CVD), metal organic chemical vapor deposition (MOCVD), and sputtering.

Figure 3B:
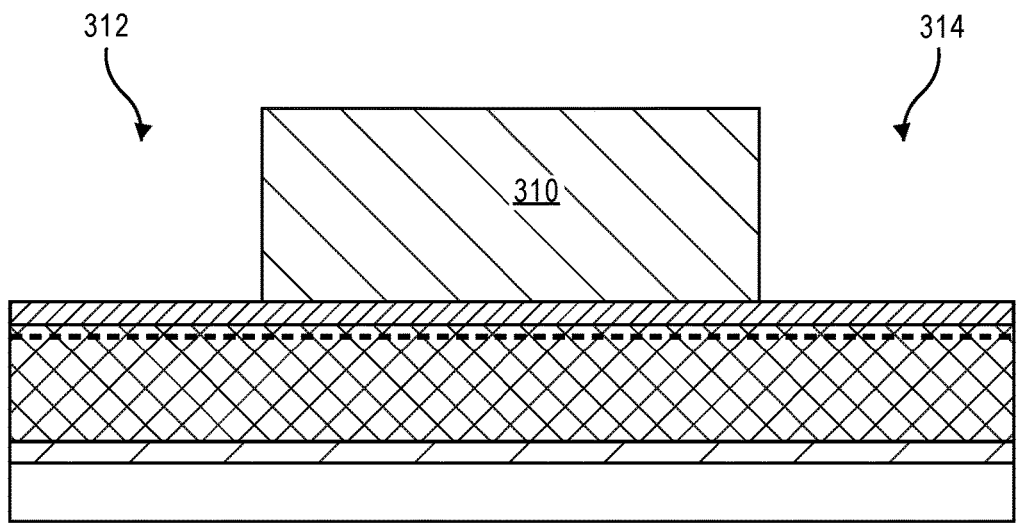

FIG. 3B illustrates the formation of a hard mask block 308 on the structure of FIG. 3A. Hard mask block 310 defines a source contact location 312, and a drain contact location 314. Hard mask block 310 may be formed of any suitable material, such as silicon nitride. Hard mask material 310 may be formed by blanket depositing a hard mask material, by for example, CVD or sputtering, and then patterning the hard mask material, by for example, lithographic patterning and etching.

Figure 3C:
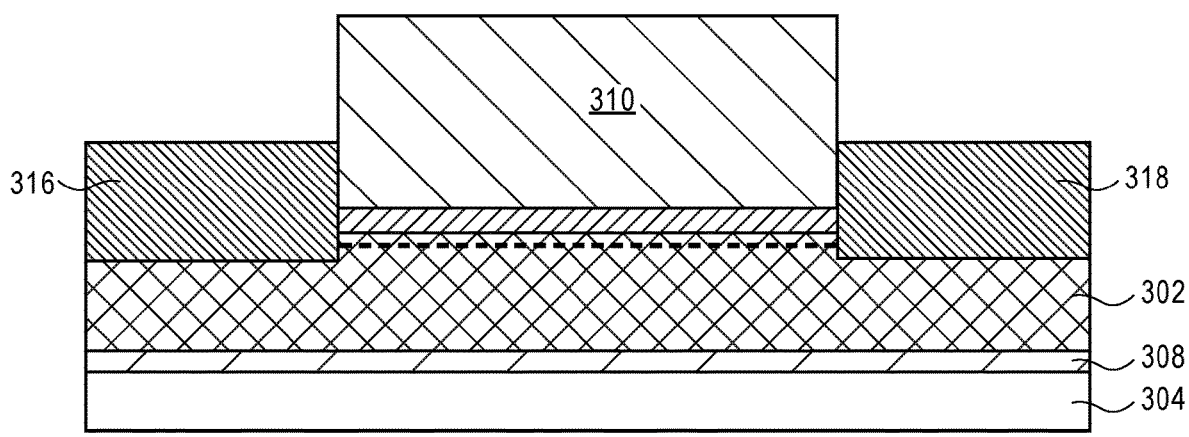

FIG. 3C illustrates the formation of source semiconductor contact 316 and drain semiconductor contact 318 on the structure of FIG. 3B. In an embodiment, source semiconductor contact 316 and drain semiconductor contact 318 are formed from a group III-N semiconductor, such as but not limited to InGaN. In an embodiment, source semiconductor contact 316 and drain semiconductor contact 318 are doped to an N+ conductivity level with silicon. In an embodiment, source semiconductor contact 316 and drain semiconductor contact 318 are epitaxially deposited by, for example, chemical vapor deposition (CVD) or metal organic chemical vapor deposition (MOCVD). In an embodiment, source semiconductor contact 316 and drain semiconductor contact 318 are formed from a III-N semiconductor having a smaller band gap then GaN. In an embodiment, source semiconductor contact 316 and drain semiconductor contact 318 are single crystalline or near single crystalline III-N semiconductors. In an embodiment, source semiconductor contact 316 and drain semiconductor contact 318 are formed in a pair of recesses etched through polarization layer 306 and into GaN layer 302 as illustrated in FIG. 3C. Source semiconductor contact 316 and drain semiconductor contact 318 disposed in trenches in GaN layer 302 may apply stress to the channel region of the fabricated transistor in order to improve device performance.

Figure 3D:
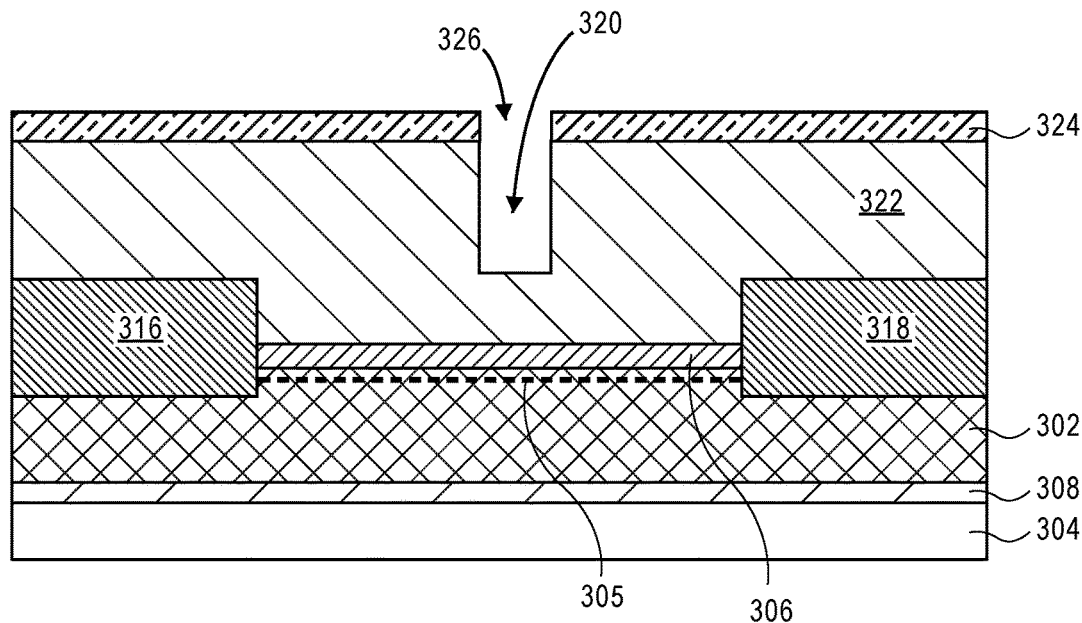

FIG. 3D illustrates a formation of a partial gate trench 320 in a dielectric layer 322. Dielectric layer 322 may be any well-known dielectric, such as but not limited to silicon oxide and carbon doped silicon oxide. A partial gate trench 320 may then be formed by first forming a patterned photoresist mask 324 over dielectric 322 which has an opening 326 which defines the location desired for a subsequently formed gate structure. Partial gate trench 320 may then be form by, for example, etching in alignment with opening 326. Partial gate trench 320 does not extend to polarization layer 306 or GaN layer 302 as illustrated in FIG. 3B. Additionally, it is to be appreciated that if multiple gate structures are desired for the fabrication of a multigate transistors, such as transistor 200 illustrated in FIG. 2, multiple partial gate trenches 320 may be etched into dielectric 322 at this time.

Figure 3E:
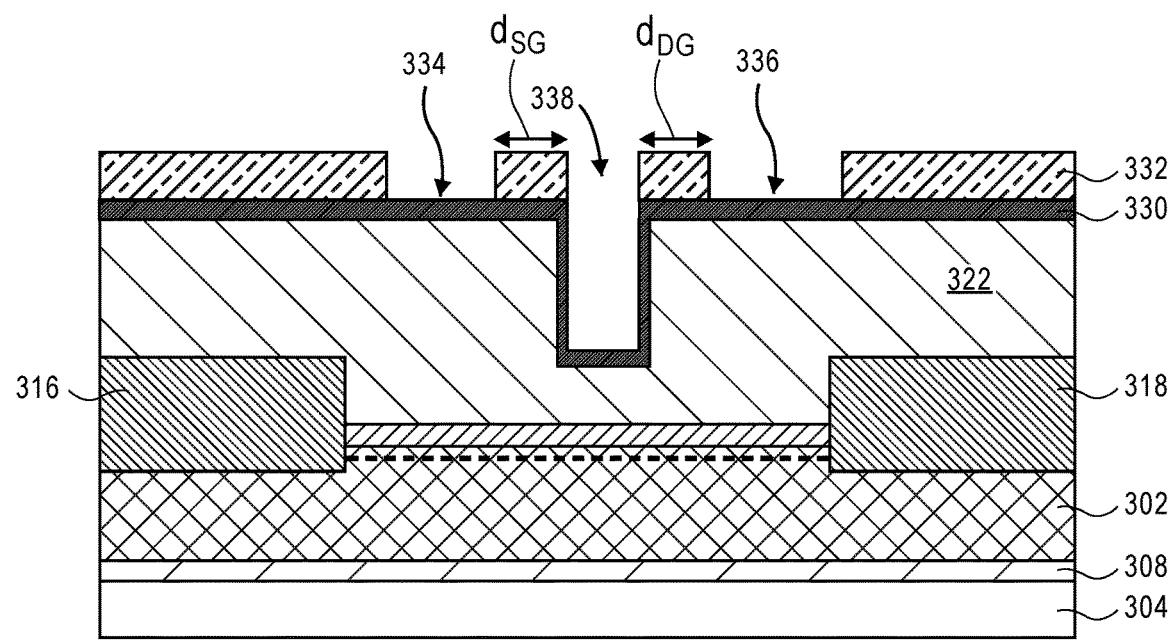

FIG. 3E illustrates the formation of a spacer/hard mask material 330 and a patterned photoresist resist layer 332. In an embodiment, spacer/hard mask material 330 is blanket deposited over the top surface of dielectric 322, along the sidewalls of partial gate trench 320 and onto the bottom surface of partial gate trench 320 as illustrated in FIG. 3E. In an embodiment, spacer/hard mask material layer 330 is formed of a material, such as but not limited to silicon nitride, which may be selectively etched with respect to dielectric 322. A photoresist layer may then be deposited over spacer/hard mask layer 330 and patterned to provide a patterned photoresist layer 332 having an opening 334 which defines a source field plate location, and an opening 336 which defines a drain field plate location and an opening 338 which defines an upper gate location as shown in FIG. 3E. In an embodiment, the location of opening 334, relative to opening 338 may define the distance ($d_{SG}$) which the subsequently formed gate structure and source field plate are separated from one another. Additionally, the location of opening 336 relative to the location of opening 338 may define the distance ($d_{DG}$) at which the subsequently formed gate structure and drain field plate are separated from one another.

In an embodiment, opening 338 defining the upper gate portion may be wider than the opening of the partial gate trench 320 so that a gate electrode may be formed which has a "T" shaped gate structure. A "T" shaped gate structure may provide a low resistance gate structure.

Figure 3F:
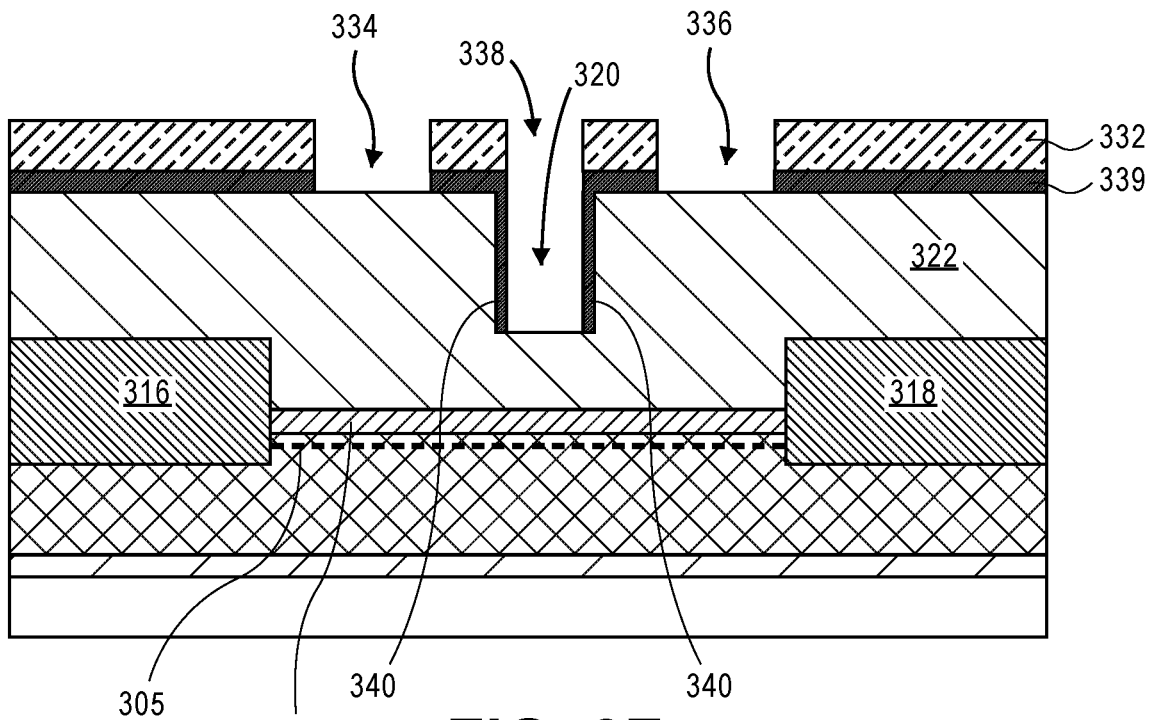

FIG. 3F illustrates the patterning of spacer/hard mask layer 330 of the structure of FIG. 3E. As illustrated in FIG. 3F, spacer/hard mask layer 330 is removed in the source field plate location 334 and in the drain field location 336 by, for example, etching to form a patterned spacer/hard mask layer 339 as illustrated in FIG. 3F. Additionally, the hard mask material located on the bottom of the partial gate trench 320 is removed while leaving insulating spacers 340 along sidewalls of partial gate trench 320 as illustrated in FIG. 3F. An anisotropic dry etch process may be used to remove exposed portions of spacer/hard mask layer 330 from horizontal surfaces while leaving spacer/hard mask layer 330 on vertical sidewalls to form spacers 340 as illustrated in FIG. 3F.

Figure 3G:
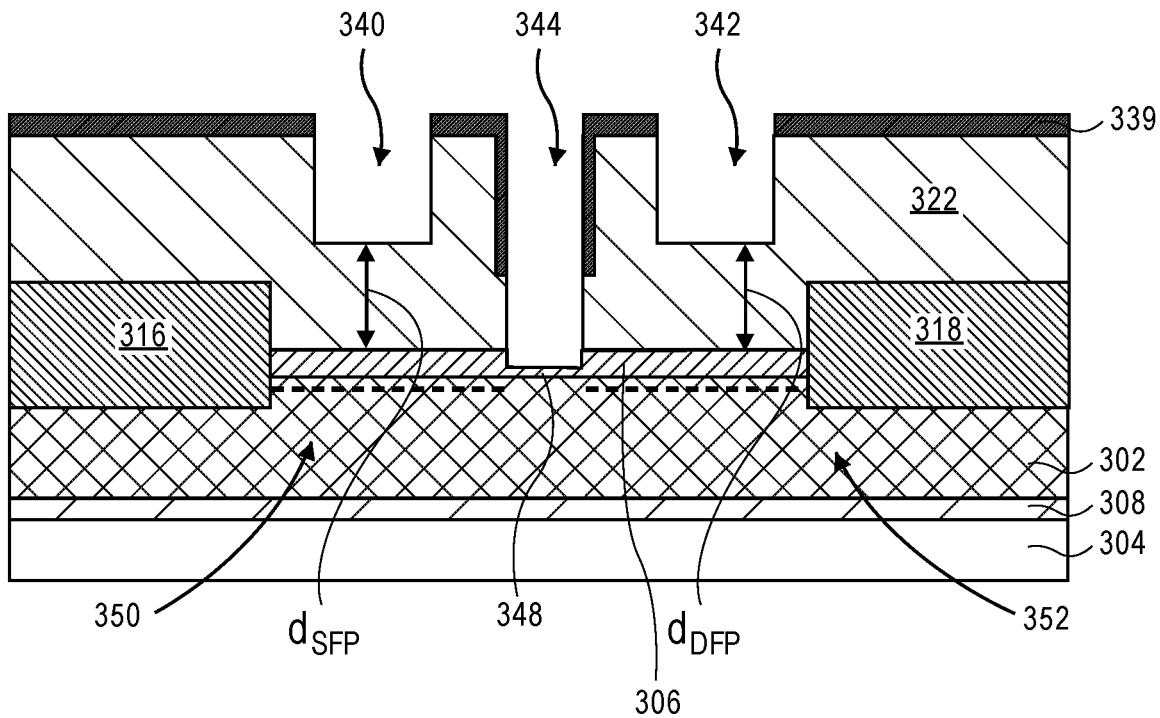

FIG. 3G illustrates the formation of a source field plate trench 340 and a drain field plate trench 342 formed in the structure of FIG. 3F. The source field plate trench 340 and the drain field plate trench 342 may be formed by etching dielectric layer 322 in alignment with patterned spacer/hard mask layer 339 as illustrated in FIG. 3G. In an embodiment, the process used to form source field plate trench 340 and drain field plate trench 342 may also be used to etch the dielectric layer 322 beneath the partial gate trench 320 to form a complete gate trench 344 and define the lower portion of the subsequently formed gate structure as illustrated in FIG. 3G. In an embodiment, complete gate trench 344 is partially etched into polarization layer 306 to create a recessed polarization layer 348 beneath complete gate trench 344. In an embodiment, recessed polarization layer 348 is of an insufficient thickness, such as less than 2 nanometers, to create a 2DEG layer or effect in the top surface of GaN layer 302 as illustrated in FIG. 3G. In an embodiment, complete gate trench 344 is formed completely through polarization layer 306 and exposes GaN layer 302. In an embodiment, where a T gate desired, the etching process also etches a wider trench in the top portion of dielectric 322 to define the upper portions of the subsequently formed gate structure.

The depth at which source field plate trench 340 is formed in dielectric layer 322 may define the distance $d_{SFP}$ which the subsequently formed source field plate extends above a source region 350. Similarly, the depth at which drain field plate trench 342 is formed in dielectric layer 322 may define the distance $d_{DFP}$ which the drain field plate extends above a drain region 352. In an embodiment, source field plate trench 340 and drain field plate trench 342 have the same depth so that the source field plate is separated from the source region 350 by the same distance that the drain field plate is separated from the drain region 352 (i.e., $d_{SFP}=d_{DFP}$).

Figure 4:
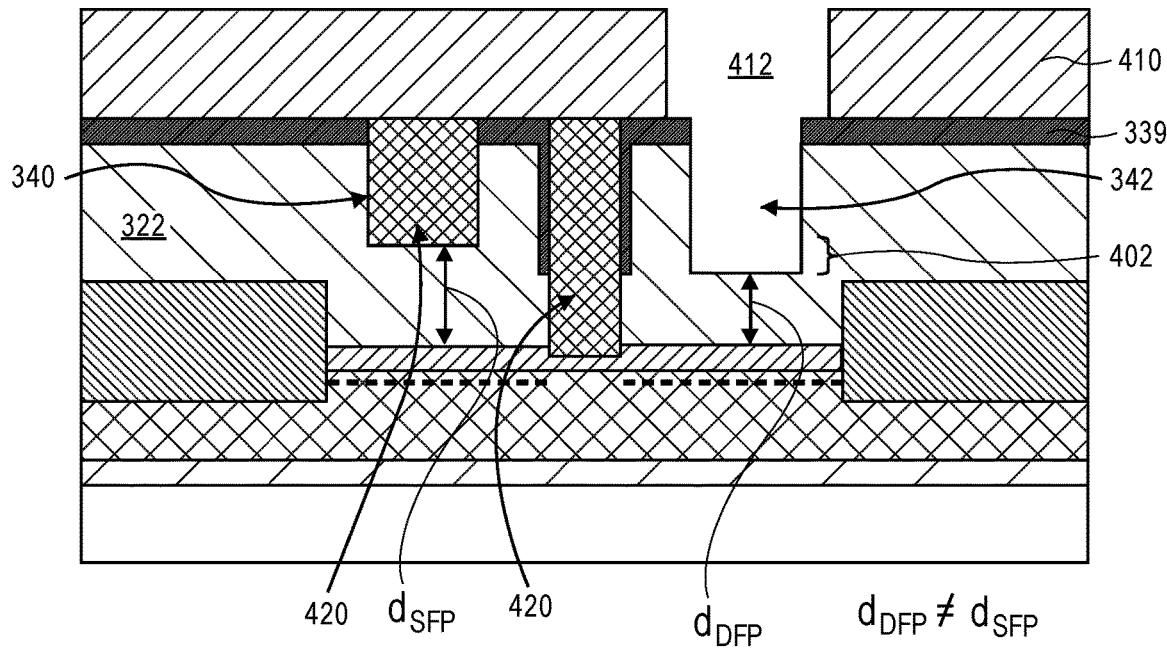
FIG. 4 illustrates an additional etching of the drain field plate trench of FIG. 3G, in accordance with embodiments of the present disclosure.

In an embodiment, it may be desirable to have the drain field plate extend a different distance above the drain region than the distance at which the source field plate extends above the source region (i.e., $d_{SFP}$ does not equal $d_{DFP}$). In an embodiment, one of the source field plate trench 340 or the drain field plate trench 342 is formed deeper into the dielectric layer 322 than the other trench. For example, as illustrated in FIG. 4, the drain field plate trench 342 may be etched an additional time to remove an additional portion 402 of dielectric material 322 to create a deeper trench. A patterned photoresist mask 410 may be disposed over the source field plate trench 340 and complete gate trench 344, as shown in FIG. 4, to protect them from further etching. In an embodiment, a material 420, such as a sacrificial light absorbing material (SLAM), may be blanket deposited and planarized to fill the complete gate trench 344, source field plate trench 340 and drain field plate trench 342 prior to the formation of patterned photoresist mask 410 in order to provide a planar surface upon which to form patterned photoresist mask 410.

Figure 3H:
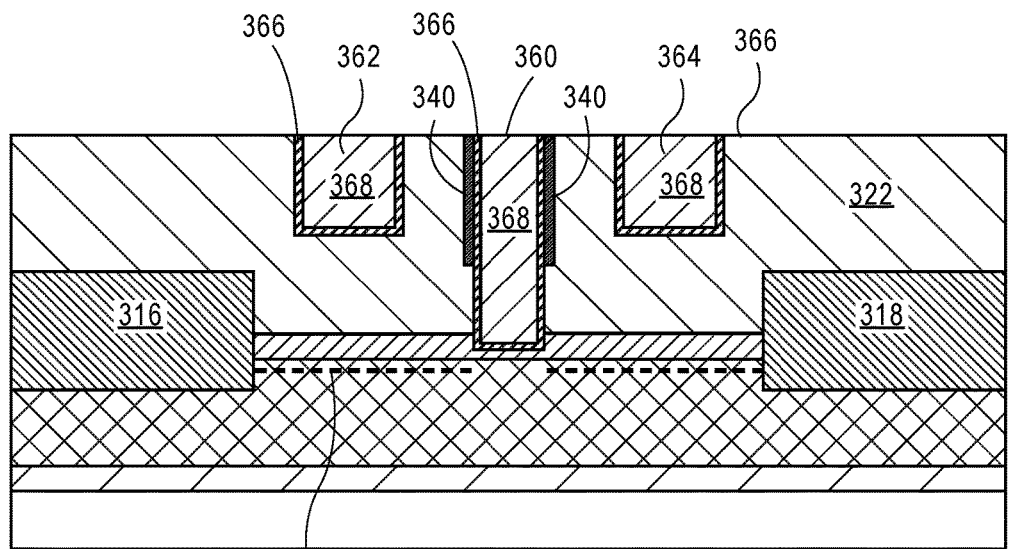

FIG. 3H illustrates the formation of a conductive material in source field plate trench 340, drain field plate trench 342 and complete gate trench 344 to form a gate structure 360, a source field plate 362, and a drain field plate 364. In an embodiment, complete gate trench 344 is filled with a gate dielectric layer 366 and a gate electrode material 368 as illustrated in FIG. 3H. In an embodiment, the gate dielectric is a high k gate dielectric, such as but not limited to hafnium oxide (e.g., $HfO_2$), zirconium oxide ($ZrO_2$) and aluminum oxide (e.g., Al₂O₃). In an embodiment, the gate dielectric layer is deposited by, for example, atomic layer deposition so that the gate dielectric layer forms on the bottom of complete gate trench 344 as well as along sidewalls of complete gate trench 344. In an embodiment, the gate dielectric 366 is in contact with sidewall spacers 340 disposed along sidewalls of complete gate trench 344. A gate electrode material, such as but not limited to titanium aluminide (TiAl), titanium nitride (TiN), or any other suitable metal or metals may be deposited by, for example, ALD or CVD on gate dielectric 366.

In an embodiment, the deposition process used to fill complete gate trench 344 is also used to fill source field plate trench 340 and drain field plate trench 342 as illustrated in FIG. 3H. Accordingly, the bottom and sidewalls of source field plate trench 340 and drain field plate trench 342 may be lined with gate dielectric layer 366 and filled with a gate electrode material 368 as illustrated in FIG. 3H. In an embodiment, gate dielectric 366 and gate electrode 368 are blanket deposited over dielectric layer 322 and into and filling source field plate trench 340, drain field plate trench 342, and complete gate trench 344. Excess gate electrode material 368 and gate dielectric layer 366 disposed on the top surface of dielectric layer 322 may be removed by a planarization process, such as but not limited to chemical mechanical polishing. The planarization process may make the top surface of the source field plate 362, the drain field plate 364 and a gate structure 360 as well as dielectric layer 322 all coplanar with one another as illustrated in FIG. 3H.

Figure 3I:
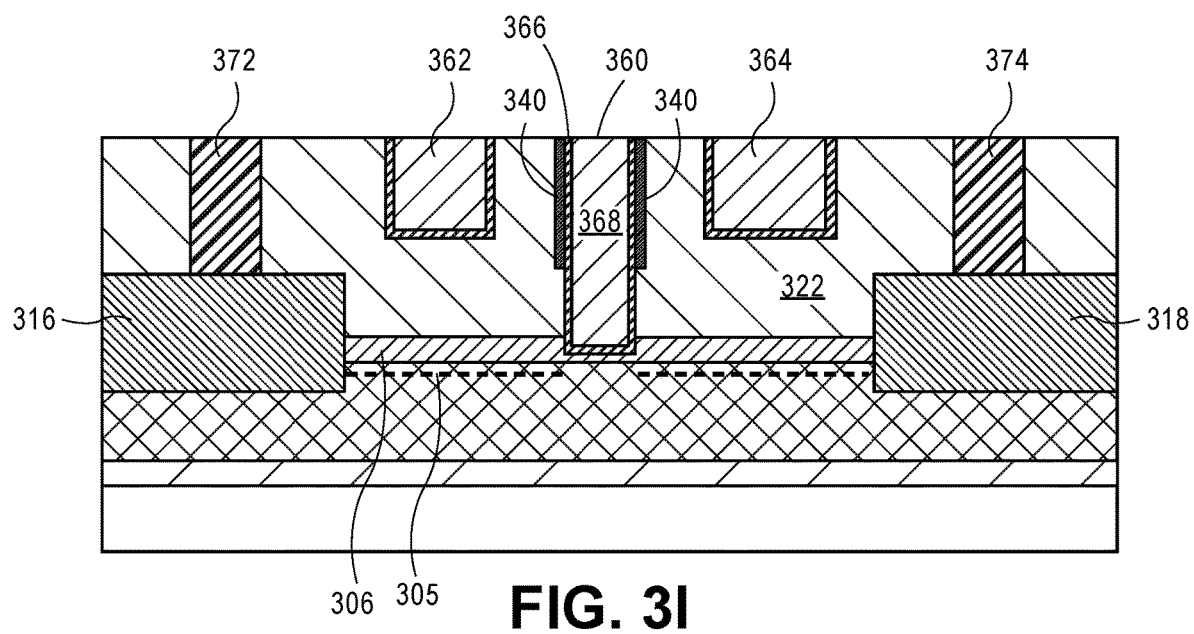

FIG. 3I illustrates the formation of a source metal contact 372 and a drain metal contact 374 in dielectric layer 322 and in contact with the source semiconductor contact 316 and drain semiconductor contact 318, respectively. Source metal contact 372 and drain metal contact 374 may be formed by etching a plurality of openings in dielectric layer 322 to expose source semiconductor contact 316 and drain semiconductor contact 318. A contact metal such as but not limited to tungsten may then be deposited into the openings and polished back.

Figure 3J:
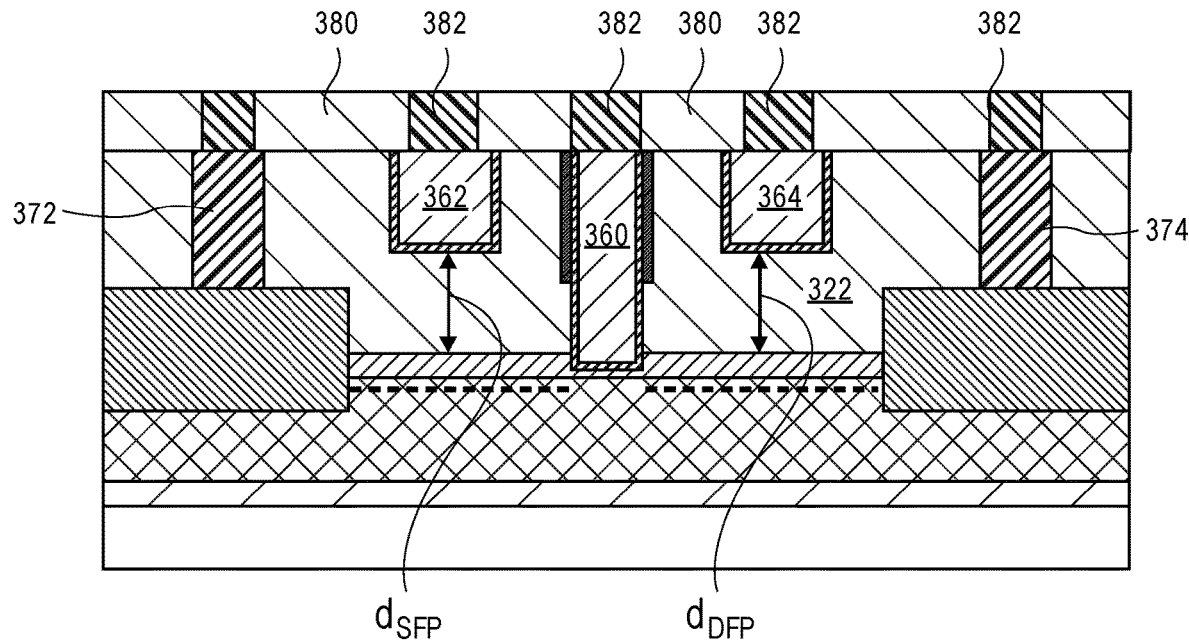

FIG. 3J illustrates the formation of a second dielectric layer 380 over the dielectric layer 322 and the formation of a plurality of via contacts 382 in the second dielectric layer 380.

Figure 5:
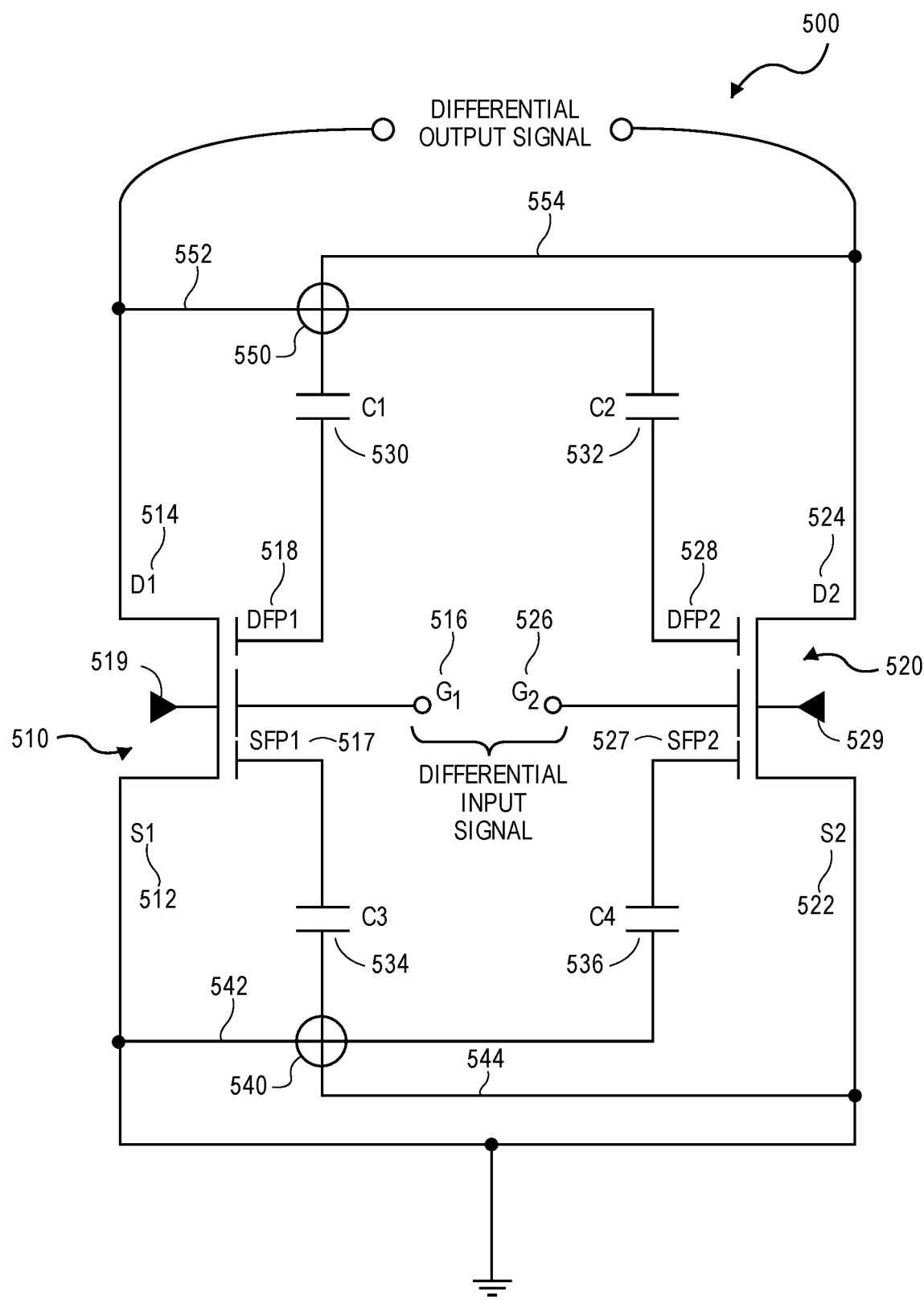
FIG. 5 illustrates a circuit comprising a first transistor and a second transistor each having a source drain field plate and a drain field plate, in accordance with embodiments of the present disclosure.

FIG. 5 illustrates a circuit 500, having a first transistor 510 and a second transistor 520. First transistor 510 and second transistor 520 may be transistors having a source drain field plate and a drain field plate as illustrated and described with respect to transistor 100 of FIG. 1. In an embodiment, transistor 510 has a source region 512, a drain region 514, a gate 516, a source field plate 517, and a drain field plate 518. Transistor 510 may include a body contact tap 519. Second transistor 520 has a source region 522, a drain region 524, a gate 526, a source field plate 527 and a drain field plate 528. Second transistor 520 may have a body contact tap 529.

A first capacitor 530 has a first electrode coupled to drain field plate 518 of first transistor 510 and a second electrode coupled to drain 524 of second transistor 520. A second capacitor 532 has a first electrode coupled to drain field plate 528 of second transistor 520 and a second electrode coupled to drain 514 of first transistor 510. A third capacitor 534 has a first electrode coupled to source field plate 517 of first transistor 510 and a second electrode coupled to source 522 of second transistor 520. A fourth capacitor 536 has a first electrode coupled to source field plate 527 of second transistor 520 and a second electrode coupled to source 512 of first transistor 510.

Circuit 500 includes a first crossover 540 where the electrical connection 542 coupling the source 512 of first transistor 510 to the source field plate 527 of second transistor 520 crosses over or under electrical connection 554 coupling source 522 of second transistor 520 to source field plate 517 of first transistor 510 without making an electrical connection thereto.

Circuit 500 includes a second crossover 550 wherein the electrical connection 552 coupling drain 514 of first transistor 510 to drain field plate 528 of the second transistor 520 crosses over or under the electrical connection 554 coupling the drain 524 of second transistor 520 to drain field plate 518 of the first transistor 510, without making an electrical connection thereto. In an embodiment, source 512 of the first transistor 510 and source 522 of the second transistor 520 are coupled to ground as illustrated in FIG. 5.

In an embodiment of the present disclosure, a differential input signal is provided between the gate 516 of first transistor 510 and the gate 526 of second transistor 520. In an embodiment, a differential output signal is outputted from drain 514 of first transistor 510 and drain 524 of second transistor 520.

In an embodiment, circuit 500 may be operated as a symmetrical crossover amplifier circuit. In an embodiment, transistors 510 and 520 are symmetrical transistors so that the source regions may act as a drain regions and the drain regions may act as source regions of the first and second transistors 510 and 520, respectively. In an embodiment, the drain regions are coupled to ground and the source regions 512 and 522 provide a differential output.

Figure 6:
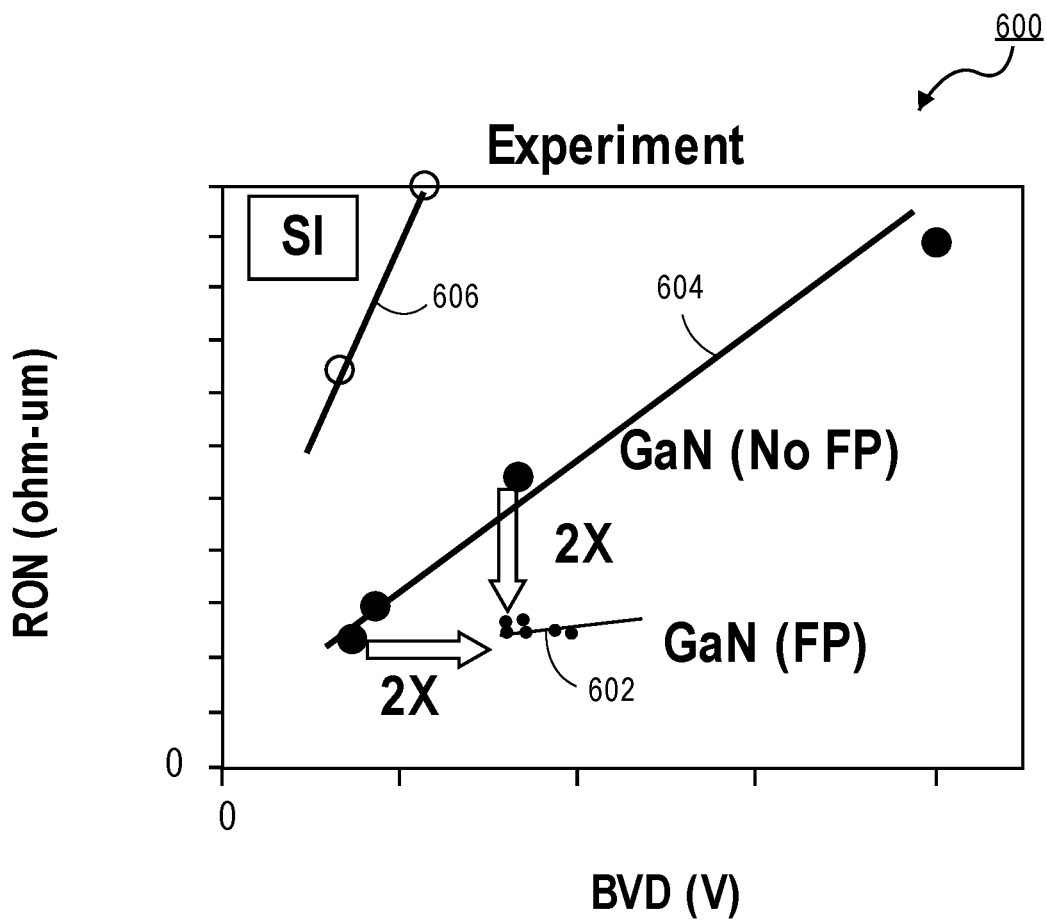
FIG. 6 is a chart illustrating the performance advantage of a GaN transistor having a drain field plate in accordance with embodiments of the present disclosure.

FIG. 6 is a chart illustrating the performance advantage of a GaN transistor, such as transistor 100, having a drain field plate. Chart 600 has the drain breakdown voltage (BVD(V)) on the X-axis and the equivalent ON resistance (RON Ohms-μm) on the Y-axis. Plot 602 shows the performance of a GaN transistor with a drain field plate and plot 604 shows the performance of a similar GaN transistor without a field plate. Plot 606 shows the performance in a silicon transistor. As shown in chart 600 of FIG. 6, a GaN transistor having a field plate shows an approximately 2× improvement in drain breakdown voltage relative to a GaN transistor without a field plate.

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
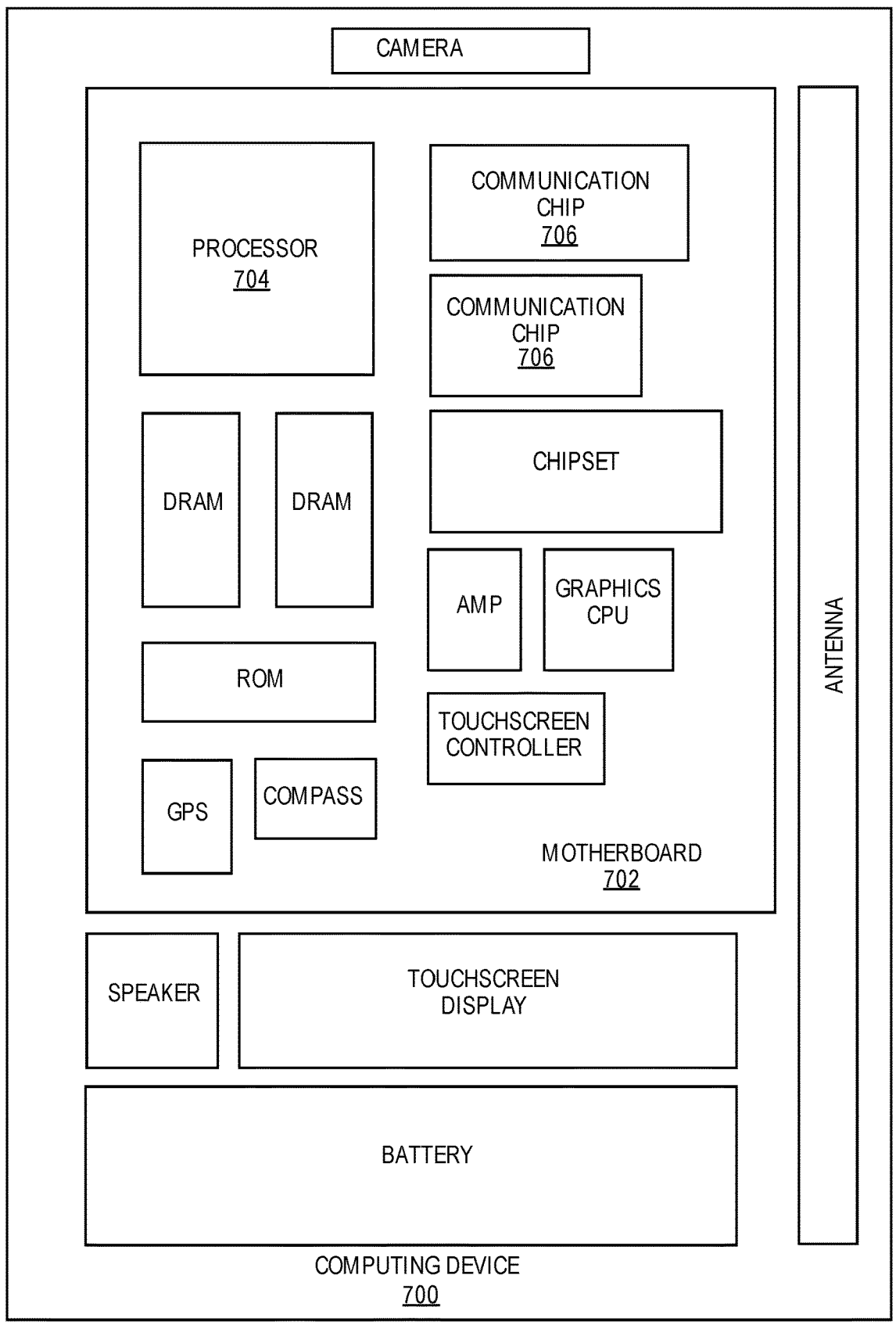
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes one or more devices, such as GaN transistors with source and drain field plates built in accordance with implementations of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the disclosure, the integrated circuit die of the communication chip includes one or more devices, such as GaN transistors with source and drain field plates built in accordance with implementations of the disclosure.

In further implementations, another component housed within the computing device 700 may contain an integrated circuit die that includes one or more devices, such as GaN transistors with source and drain field plates built in accordance with implementations of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
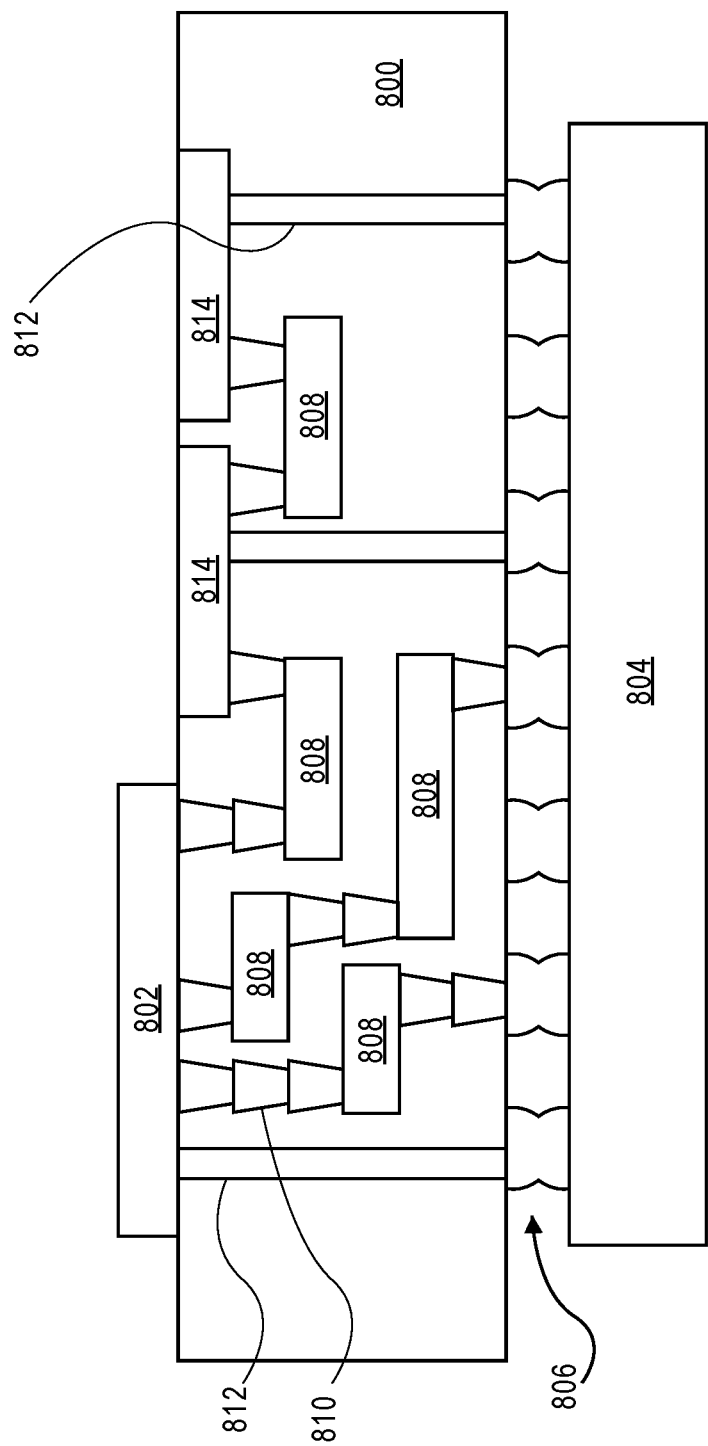
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments described herein include GaN transistors with source and drain field plates.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A transistor includes a gallium nitride (GaN) layer above a substrate, a gate structure over the GaN layer, a source region on a first side of the gate structure, a drain region on a second side of the gate structure, the second side opposite the first side, a source field plate above the source region, and a drain field plate above the drain region.

Example embodiment 2: The transistor of example embodiment 1 wherein the source field plate is separated by a first distance from the source region, and wherein the drain field plate is separated from the drain region by a second distance, wherein the first and second distances are the same.

Example embodiment 3: The transistor of example embodiment 1, wherein the source field plate is separated by a first distance from the source region and wherein the drain field plate is separated from the drain region by a second distance wherein the first distance and the second distance are different.

Example embodiment 4: The transistor of example embodiment 3, wherein the first distance is greater than the second distance.

Example embodiment 5: The transistor of example embodiment 3, wherein the second distance is greater than the first distance.

Example embodiment 6: The transistor of example embodiment 1, 2, 3, 4 or 5, wherein a voltage applied to the source field plate and applied to drain field plate are different from a gate voltage applied to the gate structure and VSS.

Example embodiment 7: The transistor of example embodiment 1, 2, 3, 4, 5 or 6, wherein the source field plate has a top surface and the drain field plate has a top surface, wherein the top surface of the source field plate and the top surface of the drain field plate are substantially coplanar with a top surface of the gate structure.

Example embodiment 8: The transistor of example embodiment 1, 2, 3, 4, 5, 6 or 7, further comprising a source metal contact wherein the source field plate is located laterally between the source metal contact and the gate structure, and a drain metal contact wherein the drain field plate is located laterally between the drain metal contact and the gate structure.

Example embodiment 9: The transistor of example embodiment 1, 2, 3, 4, 5, 6, 7 or 8, wherein the source field plate is separated from the gate structure by a first distance and wherein the drain field plate is separated from the gate structure by a second distance wherein the first distance and second distance are the same.

Example embodiment 10: The transistor of example embodiment 1, 2, 3, 4, 5, 6, 7, 8 or 9, further comprising a first spacer on a source side of the gate structure and a second spacer on a drain side of the gate structure.

Example embodiment 11: The transistor of example embodiment 1, 2, 3, 4, 5, 6, 7, 8, 9 or 10, further comprising a second gate structure, the second gate structure over the GaN layer and between the gate structure and the drain field plate.

Example embodiment 12: A system includes a board, the board including a processor and a communication chip. One of the processor or the communications chip has a transistor comprising: a gallium nitride (GaN) layer above a substrate, a gate structure over the GaN layer, a source region on a first side of the gate structure, a drain region on a second side of the gate structure, the second side opposite the first side, a source field plate above the source region, and a drain field plate above the drain region.

Example embodiment 13: The system of example embodiment 12, wherein the source field plate is separated by a first distance from the source region, and wherein the drain field plate is separated from the drain region by a second distance, wherein the first and second distances are the same.

Example embodiment 14: The system of example embodiment 12, wherein the source field plate is separated by a first distance from the source region and wherein the drain field plate is separated from the drain region by a second distance wherein the first distance and the second distance are different.

Example embodiment 15: The system of example embodiment 14, wherein the first distance is greater than the second distance.

Example embodiment 16: The system of example embodiment 14, wherein the second distance is greater than the first distance.

Example embodiment 17: The system of example embodiment 12, 13, 14, 15 or 16 wherein the source field plate has a top surface and the drain field plate has a top surface, wherein the top surface of the source field plate and the top surface of the drain field plate are substantially coplanar with a top surface of the gate structure.

Example embodiment 18: The system of example embodiment 12, 13, 14, 15, 16 or 17 wherein the source field plate is separated from the gate structure by a first distance and wherein the drain field plate is separated from the gate structure by a second distance wherein the first distance and second distance are the same.

Example embodiment 19: The system of example embodiment 12, 13, 14, 15, 16, 17 or 18 further comprising a first spacer on a side of the gate structure nearest the source field plate and a second spacer on the side of the gate structure nearest the drain field plate.

Example embodiment 20: The system of example embodiment 12, 13, 14, 15, 16, 17, 18 or 19 further comprising a second gate structure, the second gate structure over the GaN layer and between the gate structure and the drain field plate.

Example embodiment 21: A method of forming a transistor comprising forming a gate trench in a dielectric layer above a GaN layer, the gate trench having opposite sidewalls, the trench having a first depth. The method also includes forming a source field plate trench and a drain field plate trench in the dielectric layer on opposite sides of the gate trench, and increasing the trench depth of the gate trench to a second depth. The method also includes filling the gate trench, the source field trench, and the drain field trench with a conductor.

Example embodiment 22: The method of example embodiment 21 further comprising forming a hard mask over the dielectric layer and on the sidewalls of the gate trench and on the bottom of the gate trench prior to forming the source field plate trench and the drain field plate trench.

Example embodiment 23: The method of example embodiment 22 further comprising forming a first sidewall spacer from the hard mask on a source side of the gate trench and a second sidewall spacer from the hard mask on a drain side of the gate trench.

Example embodiment 24: The method of example embodiment 21, 22 or 23, wherein one of the source field plate trench or the drain field plate trench has a depth grater than the depth of the other of the source field plate trench or the drain field plate trench.

Example embodiment 25: The method of example embodiment 21, 22, 23 or 24, further comprising forming a polarization layer on the GaN layer.

Example embodiment 26: The method of example embodiment 21, 22, 23, 24 or 25, further comprising forming a source semiconductor contact on a first side of the gate structure and a drain semiconductor contact on a second opposite side of the gate structure.

Example embodiment 27: The method of example embodiment 26, wherein the source semiconductor contact and the drain semiconductor contact comprise indium, gallium and nitrogen.

Example embodiment 28: The method of example embodiment 21, 22, 23, 24, 25, 26 or 27, further comprising forming a second gate trench in the dielectric layer, the second gate trench between the gate trench and the drain field plate trench.

Example embodiment 29: A circuit includes a first transistor including a gallium nitride (GaN) layer above a substrate, a first gate structure over the GaN layer, a first source region on a first side of the first gate structure, a first drain region on a second side of the first gate structure, the second side opposite the first side, a first source field plate above the first source region, and a first drain field plate above the first drain region. The circuit also includes a second transistor including a second gate structure over the GaN layer, a second source region on a first side of the second gate structure, a second drain region on a second side of the second gate structure, the second side opposite the first side, a second source field plate above the second source region, and a second drain field plate above the second drain region. The circuit also includes a first capacitor coupled between the first drain field plate of the first transistor and the second drain of the second transistor, a second capacitor coupled between the second drain field plate of the second transistor and the first drain of the first transistor, a third capacitor coupled between the first source field plate of the first transistor and the second source of the second transistor, and a fourth capacitor coupled between the second source field plate of the second transistor and the first source of the first transistor.

Example embodiment 30: The circuit of example embodiment 29, wherein the first source field plate is separated by a first distance from the first source region, wherein the first drain field plate is separated from the first drain region by a second distance, wherein the second source field plate is separated by a third distance from the second source region, wherein the second drain field plate is separated from the second drain region by a fourth distance, and wherein the first, second, third and fourth distances are the same.

Example embodiment 31: The circuit of example embodiment 29 or 30, wherein the first source field plate is separated from the first gate structure by a first distance, wherein the first drain field plate is separated from the first gate structure by a second distance, wherein the second source field plate is separated from the second gate structure by a third distance, wherein the second drain field plate is separated from the second gate structure by a fourth distance, and wherein the first distance, the second distance, the third distance and the fourth distance are the same.

What is claimed is:

1. A transistor comprising:
    a gallium nitride (GaN) layer above a substrate;
    a gate structure over the GaN layer, the gate structure including a gate electrode;
    a source region on a first side of the gate structure;
    a drain region on a second side of the gate structure, the second side opposite the first side;
    a source field plate above the source region, wherein the source field plate is not vertically overlapping with the gate electrode;
    a drain field plate above the drain region, wherein the drain field plate is not vertically overlapping with the gate electrode;
    a source metal contact coupled to the source region, the source metal contact laterally spaced apart from the source field plate; and
    a drain metal contact coupled to the drain region, the drain metal contact laterally spaced apart from the drain field plate.

2. The transistor of claim 1 wherein the source field plate is separated by a first distance from the source region, and wherein the drain field plate is separated from the drain region by a second distance, wherein the first and second distances are the same.

3. The transistor of claim 1 wherein the source field plate is separated by a first distance from the source region and wherein the drain field plate is separated from the drain region by a second distance wherein the first distance and the second distance are different.

4. The transistor of claim 3 wherein the first distance is greater than the second distance.

5. The transistor of claim 3 wherein the second distance is greater than the first distance.

6. The transistor of claim 1 wherein a voltage applied to the source field plate and applied to drain field plate are different from a gate voltage applied to the gate structure and VSS.

7. The transistor of claim 1 wherein the source field plate has a top surface and the drain field plate has a top surface, wherein the top surface of the source field plate and the top surface of the drain field plate are substantially coplanar with a top surface of the gate structure.

8. The transistor of claim 1 wherein the source field plate is separated from the gate structure by a first distance and wherein the drain field plate is separated from the gate structure by a second distance wherein the first distance and second distance are the same.

9. The transistor of claim 1 further comprising a first spacer on a source side of the gate structure and a second spacer on a drain side of the gate structure.

10. The transistor of claim 1 further comprising a second gate structure, the second gate structure over the GaN layer and between the gate structure and the drain field plate.

11. A circuit, comprising: a first transistor, comprising:
    a gallium nitride (GaN) layer above a substrate;
    a first gate structure over the GaN layer;
    a first source region on a first side of the first gate structure;
    a first drain region on a second side of the first gate structure, the second side opposite the first side;
    a first source field plate above the first source region; and
    a first drain field plate above the first drain region;
    a second transistor, comprising:
       a second gate structure over the GaN layer;
       a second source region on a first side of the second gate structure;
       a second drain region on a second side of the second gate structure, the second side opposite the first side;
       a second source field plate above the second source region; and
       a second drain field plate above the second drain region;
       a first capacitor coupled between the first drain field plate of the first transistor and the second drain of the second transistor;
       a second capacitor coupled between the second drain field plate of the second transistor and the first drain of the first transistor;
       a third capacitor coupled between the first source field plate of the first transistor and the second source of the second transistor; and
    a fourth capacitor coupled between the second source field plate of the second transistor and the first source of the first transistor.

12. The circuit of claim 11 wherein the first source field plate is separated by a first distance from the first source region, wherein the first drain field plate is separated from the first drain region by a second distance, wherein the second source field plate is separated by a third distance from the second source region, wherein the second drain field plate is separated from the second drain region by a fourth distance, and wherein the first, second, third and fourth distances are the same.

13. The circuit of claim 11 wherein the first source field plate is separated from the first gate structure by a first distance, wherein the first drain field plate is separated from the first gate structure by a second distance, wherein the second source field plate is separated from the second gate structure by a third distance, wherein the second drain field plate is separated from the second gate structure by a fourth distance, and wherein the first distance, the second distance, the third distance and the fourth distance are the same.

14. A transistor comprising:
- a gallium nitride (GaN) layer above a substrate;
- a gate structure over the GaN layer;
- a source region on a first side of the gate structure;
- a drain region on a second side of the gate structure, the second side opposite the first side;
- a source field plate above the source region;
- a drain field plate above the drain region; and
- a second gate structure, the second gate structure over the GaN layer and between the gate structure and the drain field plate.

* * * * *